US009310679B2

(12) United States Patent
Hauck et al.

(10) Patent No.: US 9,310,679 B2
(45) Date of Patent: *Apr. 12, 2016

(54) MAKING LITHOGRAPHIC PRINTING PLATES

(71) Applicant: Eastman Kodak Company, Rochester, NY (US)

(72) Inventors: Gerhard Hauck, Badenhausen (DE); Dietmar Frank, Osterode (DE); Celin Savariar-Hauck, Badenhausen (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/296,788

(22) Filed: Jun. 5, 2014

(65) Prior Publication Data
US 2014/0283703 A1 Sep. 25, 2014

Related U.S. Application Data

(62) Division of application No. 13/602,367, filed on Sep. 4, 2012, now Pat. No. 8,936,899.

(51) Int. Cl.
| *G03F 7/00* | (2006.01) |
| *G03F 7/027* | (2006.01) |
| *G03F 7/004* | (2006.01) |
| *G03F 7/09* | (2006.01) |
| *G03F 7/20* | (2006.01) |
| *G03F 7/32* | (2006.01) |
| *B41C 1/10* | (2006.01) |
| *B41N 3/03* | (2006.01) |

(52) U.S. Cl.
CPC . *G03F 7/027* (2013.01); *B41C 1/10* (2013.01); *B41C 1/1016* (2013.01); *B41N 3/036* (2013.01); *G03F 7/0045* (2013.01); *G03F 7/09* (2013.01); *G03F 7/202* (2013.01); *G03F 7/322* (2013.01); *B41C 2210/02* (2013.01); *B41C 2210/06* (2013.01); *B41C 2210/14* (2013.01)

(58) Field of Classification Search
CPC .......................................................... B41C 1/10
USPC ...................... 430/270.1, 302; 101/453, 463.1
See application file for complete search history.

(56) References Cited

U.S. PATENT DOCUMENTS

| 2,614,912 | A | * | 10/1952 | Rice ......................... B44C 1/04 148/244 |
| 4,415,652 | A | * | 11/1983 | Proskow .................... 430/277.1 |
| 5,747,216 | A | | 5/1998 | Watanabe et al. |
| 6,245,481 | B1 | | 6/2001 | Teng |
| 8,034,538 | B2 | | 10/2011 | Strehmel et al. |
| 2002/0172874 | A1 | | 11/2002 | Horne et al. |
| 2003/0091932 | A1 | | 5/2003 | Loccufier et al. |
| 2004/0048195 | A1 | | 3/2004 | Deroover et al. |
| 2008/0206674 | A1 | * | 8/2008 | Savariar-Hauck et al. 430/281.1 |
| 2010/0227269 | A1 | * | 9/2010 | Simpson et al. ........... 430/270.1 |
| 2011/0065048 | A1 | * | 3/2011 | Kearney et al. ............ 430/286.1 |
| 2011/0155009 | A1 | | 6/2011 | Strehmel et al. |
| 2012/0125216 | A1 | * | 5/2012 | Levanon et al. .............. 101/453 |
| 2012/0219915 | A1 | | 8/2012 | Figov et al. |

FOREIGN PATENT DOCUMENTS

| EP | 0932080 | A1 | 7/1999 |
| EP | 1177911 | A1 | 2/2002 |
| EP | 1865378 | A1 | 12/2007 |
| EP | 2263885 | A1 | 12/2010 |
| EP | 2439591 | A1 | 4/2012 |
| EP | 2568339 | A2 | 3/2013 |

* cited by examiner

*Primary Examiner* — Chanceity Robinson
(74) *Attorney, Agent, or Firm* — J. Lanny Tucker

(57) ABSTRACT

A thermally-sensitive, positive-working lithographic printing plate precursor can be used to prepare lithographic printing plates using high pH, silicate-free processing solutions. The precursor has a grained an anodized aluminum-containing substrate including a poly(vinyl phosphonic acid) interlayer. A first ink receptive layer, and optionally a second ink receptive layer, is disposed directly on the poly(vinyl phosphonic acid) interlayer. This first ink receptive layer comprises an aromatic acid dye that comprises at least two aromatic groups in an amount of least 0.5 weight %. In addition, the precursor comprises an infrared radiation absorber in one of the layers.

12 Claims, No Drawings

MAKING LITHOGRAPHIC PRINTING PLATES

CROSS-REFERENCE TO RELATED APPLICATIONS

This is a divisional of U.S. patent application Ser. No. 13/602,367, filed Sep. 4, 2012, which is incorporated herein by reference in its entirety and now granted as U.S. Pat. No. 8,936,899.

This application has related subject matter to U.S. patent application Ser. No. 13/711,648, filed Dec. 12, 2012 (now issued as U.S. Pat. No. 8,530,141), which is a Continuation-in-part of U.S. patent application Ser. No. 12/606,378, filed Oct. 27, 2009 (now abandoned).

FIELD OF THE INVENTION

This invention relates to imaging and processing positive-working lithographic printing plate precursors that have a unique acid dye in the layer adjacent to the substrate, using infrared radiation to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements (lithographic printing plate precursors) useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the imageable element is considered as positive-working. Conversely, if the non-imaged regions are removed, the imageable element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The lithographic printing plate precursors used for the preparation of lithographic printing plates have been designed to be sensitive to heat or infrared radiation and can be exposed using thermal heads or more usually, infrared laser diodes that image in response to signals from a digital image in a computer a platesetter. This "computer-to-plate" technology has generally replaced the former technology where masking films were used to image the elements.

These imaging techniques often require the use of water or a developer (neutral to alkaline pH) as a processing solution to remove exposed (positive-working) or non-exposed (negative-working) regions of the imaged layer(s). In general, the processing solution is specifically designed for the specific radiation-sensitive chemistry in the imaged precursor even though there is a general desire in the industry to design one processing solution that can be used with much different imaging chemistry.

Contrast dyes are often incorporated in precursor imaging layer formulations in order to provide a color for easy precursor handling and enabling inspection of defects during manufacturing. The color from a contrast dye serves an important function in the pre-press readability of dots for calibrations and in the printing press room to recognize register marks for precise fitting on the printing press. In positive-working lithographic printing plate precursors, both single-layered and double-layered precursors, contrast dyes often serve the additional function of causing inhibition of the imaging formulation to developer attack and thereby stabilizing the dots in the resulting image. However, a significant problem has been encountered with the use of highly colored contrast dyes. They can cause "staining" of the non-imaged regions after development (processing).

One way to reduce this post-processing staining is to apply an interlayer on the aluminum substrate before the image layer formulation(s) are applied. An interlayer that is commonly used is poly(vinyl phosphonic acid) (PVPA) that can be applied either as a spray or in a coating bath process. For many processing methods that use low pH developers or high pH, silicate-containing developers, the presence of the PVPA interlayer is sufficient to avoid staining from the contrast dyes.

However, when high pH, non-silicate-containing developers are used to process some positive-working imaging formulations comprising a strong contrast dye, high staining can occur after development. One approach to solving this problem has been to use an alternative interlayer (instead of the PVPA interlayer). For example, some in the industry have incorporated an interlayer formed from a phosphate/fluoride (PF) process to reduce staining.

However, the use of this phosphate/fluoride process is undesirable because of the hazardous materials used or formed (HF and cryolith) in the process. In addition, considerable expense is required to install the equipment necessary to use the phosphate/fluoride process and such equipment requires additional space in the manufacturing facility, adding further costs.

There is a need to find useful contrast dyes for positive-working lithographic printing plate precursors that cause no staining when PVPA interlayers are used on the substrates and when the imaged precursors are processed using a high pH, non silicate developer.

SUMMARY OF THE INVENTION

Positive-working lithographic printing plate precursors useful in the present invention comprise:
  a grained and anodized aluminum-containing substrate,
  a poly(vinyl phosphonic acid) interlayer disposed directly on the grained and anodized aluminum substrate,
  a first ink receptive layer that is disposed directly on the poly(vinyl phosphonic acid) interlayer, the first ink receptive layer comprising at least one water-insoluble, alkali solution-soluble or -dispersible resin, and an aromatic acid dye that comprises at least two aromatic groups and that is present in an amount of at least 0.5 weight %, based on the total dry weight of the first receptive layer, wherein each aromatic group has at least one anionic group selected from the group consisting of carboxylate, sulfonate, phenolate, and phosphonate groups, the positive-working lithographic printing plate precursor being infrared radiation-sensitive and further comprising an infrared radiation absorber in either the first ink receptive layer or in an optional second ink receptive layer that is disposed over the first ink receptive layer, or in both of the first and second ink receptive layers.

The present invention provides a method for forming a lithographic printing plate, comprising:

imagewise exposing the positive-working lithographic printing plate precursor of any embodiments described herein with infrared radiation to form an imaged precursor comprising exposed regions and non-exposed regions in the first ink receptive layer and the second ink receptive layer, if present, and processing the imaged precursor to remove the exposed regions of the first ink receptive layer and of the second ink receptive layer, if present, using a silicate-free processing solution having a pH of at least 12.5 and up to and including 14.

The present invention provides a positive-working lithographic printing plate precursor that exhibits reduced staining when a poly(vinyl phosphonic acid) (PVPA) interlayer is incorporated on the substrate and under the one or more imageable or ink receptive layers. This improvement is particularly evident when the imaged precursors are processed using high pH, silicate-free processing solutions.

These advantages are achieved by using certain aromatic acid dyes in one or more imageable layers in the precursor. These aromatic acid dyes are particularly useful when incorporated into the imageable or ink receptive layer that is closest to the PVPA interlayer. It has been found that these aromatic acid dyes can provide desired color contrast while reducing stain that can occur from development (processing) using silicate-free, high pH processing solutions.

DETAILED DESCRIPTION OF THE INVENTION

Definitions

As used herein to define various components of the positive-working lithographic printing plate precursors, processing solutions, ink receptive compositions, formulations, and layers, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor," "positive-working lithographic printing plate precursor," and "precursor" are meant to be references to embodiments of the present invention.

The term "support" is used herein to refer to an aluminum-containing material (web, sheet, foil, or other form) that is then treated to prepare a "substrate" that refers to the hydrophilic article upon which various ink receptive layers are disposed.

The term "post-treatment" refers to treating the grained and anodized aluminum-containing support with an aqueous solution to coat it with a poly(vinyl phosphonic acid) interlayer formulation on the grained and anodized aluminum-containing substrate. Such a "post-treatment" is used in the practice of the present invention before any ink receptive layer formulations are applied.

The precursors can be "single-layer precursors" comprising a single ink receptive (or imageable) layer that is identified as the first ink receptive layer. Alternative precursors can be "double-layer precursors" having two ink receptive layers identified as a first receptive layer nearest the substrate and a second ink receptive layer that is disposed over the first receptive layer. In some literature, the first ink receptive layer is known as the "inner" or inside imageable layer, and the second ink receptive layer is known as the "outer" or outside imageable layer.

The term "ink receptive," as applied to the layers in the precursors, refers to a coating or layer material to which, after lithographic printing plate after imaging and development, lithographic ink is attracted.

Unless otherwise indicated, percentages refer to percents by dry weight of a composition or layer, or % solids of a solution or formulation.

As used herein, the term "infrared" refers to radiation having a $\lambda_{max}$ of at least 700 nm and higher. In most instances, the term "infrared" is used to refer to the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Positive-Working Lithographic Printing Plate Precursors

Aromatic Acid Dyes:

The aromatic acid dyes useful in the present invention are located in the first ink receptive layer of the precursor and each one comprises at least two aromatic groups, and generally have two or more carboxylate, sulfonate, phenolate, or phosphonate groups. Each aromatic nucleus has at least one of such acidic groups. Aromatic dyes comprising two or more sulfonate or carboxylate, or both carboxylate and sulfonate groups, are particularly useful.

Useful classes of aromatic acid dyes include but are not limited to, acidic bis-azo dyes (such as Naphthol blue black and Trypan blue), acidic tris-azo dyes (such as Direct Blue 71), acidic triphenyl methane dyes (such as methyl blue, alumion, and Eosin Y), the acidity of which arises from acid group substituents such as sulfonic acid groups. Any amino group substituents present on the aromatic groups are either primary amino groups or secondary amino groups (and not tertiary amino groups) for example as in anthraquinone dyes (such as Alizarin Blue Black B). Some useful aromatic acid dyes are demonstrated below in the Invention Examples.

These aromatic acid dyes also provide contrast between imaged and non-imaged regions of the first receptive layer, and can also thus serve as "contrast" dyes in the precursor. As such, the aromatic acid dyes generally have an absorption peak of at least 400 nm to and including 700 nm.

One or more aromatic acid dyes are present in the first ink receptive layer in an amount of at least 0.2 weight % and generally up to and including 10 weight %, or typically at least 0.5 weight % and up to and including 5 weight %, all based on the total dry weight of the first ink receptive layer.

In general, the first ink receptive layer comprising the one or more aromatic acid dyes is substantially free of basic dyes having an absorption peak of at least 400 nm and up to and including 700 nm. By "substantially free" is meant that such basic dyes are present in an amount of less than 0.1 weight %, based on the total dry weight of the first ink receptive layer.

Grained and Anodized Aluminum-Containing Substrate:

In general, the lithographic printing plate precursors are formed by suitable application of one or more ink receptive layer compositions to a suitable aluminum-containing substrate to form one or more ink receptive layers. This aluminum-containing substrate is usually treated or coated in various ways as described below prior to application of the formulation(s). For example, the aluminum-containing substrate is treated to provide an "interlayer" for improved adhesion or hydrophilicity, and the first ink receptive layer and optional second ink receptive layer, is applied over the interlayer.

The aluminum-containing substrate generally has a hydrophilic surface, or a surface that is more hydrophilic than the applied ink receptive layer formulation on the imaging side. The aluminum-containing substrate comprises an aluminum support that is coated or treated using physical graining, electrochemical graining and chemical graining, followed by anodizing using a suitable acid to provide the desired anodic oxide surface and a desired oxide pore diameter. The aluminum sheet is mechanically or electrochemically grained and anodized using phosphoric acid or sulfuric acid and conventional procedures. Anodization can be carried out using any suitable technique that provides these properties, but in many embodiments, the present invention comprises providing a phosphoric acid anodized aluminum substrate comprising the average oxide pore diameter of at least 15 nm and up to and including 80 nm.

Alternatively, the aluminum support can be anodized with sulfuric acid to obtain the desired anodic oxide pore size. For example, an electrochemically grained aluminum support can be anodized in an alternating current passing through a sulfuric acid solution (5-30 weight %) at a temperature of at least 20° C. and up to and including 60° C. for at least 5 seconds and up to and including 250 seconds to form an oxide layer on the metal surface. Generally, sulfuric acid anodization is carried out to provide an aluminum oxide layer of at least 0.3 g/m$^2$ and typically at least 1 g/m$^2$ and up to and including 10 g/m$^2$, or up to and including 5 g/m$^2$.

The sulfuric acid formed aluminum oxide layer generally has fine concave parts that are sometimes referred to as "micropores" or "pores" that are distributed, perhaps uniformly, over the layer surface. The density (or vacancy) is generally controlled by properly selecting the conditions of the sulfuric acid anodization treatment. The pores can appear as columns within the aluminum oxide layer, as viewed in a cross-sectional microimage. These columnar pores can have an average diameter of less than 20 nm before they are treated to widen the average diameter at the outermost surface, or most of the columnar pores have an average diameter of at least 5 nm and up to and including 20 nm before they are treated.

The electrochemically grained and sulfuric acid anodized aluminum-containing support can be treated to widen the pores in the aluminum oxide layer ("pore-widening treatment") so that the diameter of the columnar pores at their outermost surface (that is, nearest the outermost layer surface) is at least 90%, and more typically at least 92%, and even more than 100% of the average diameter of the columnar pores. The average diameter of the columnar pores can be measured using a field emission scanning electron microscope. Once this average diameter is determined, it is possible to determine whether the diameter at the outermost surface is at least 90% of that average diameter value using similar measuring techniques.

The columnar pores can be widened using an alkaline or acidic pore-widening solution to remove at least 10 weight % and up to and including 80 weight %, typically at least 10 weight % and up to and including 60 weight %, or more likely at least 20 weight % and up to and including 50 weight %, of the original aluminum oxide layer. Pore widening can thus be accomplished using an alkaline solution containing sodium hydroxide, potassium hydroxide, lithium hydroxide, or mixtures of hydroxides, having a pH of at least 11 and up to and including 13, or more likely having a pH of at least 11.5 and up to and including 12.5, and a hydroxide (such as a sodium hydroxide) concentration of at least 0.15 g/l and up to and including 1.5 g/l. The alkaline or acidic pore-widening solution generally has conductivity of at least 0.8 mS/cm and up to and including 8.2 mS/cm.

Alternatively, one can use an acidic solution containing an inorganic acid such as sulfuric acid, phosphoric acid, hydrochloric acid, nitric acid, or mixtures of these acids at a concentration of at least 10 g/l and up to and including 500 g/l, or more likely of at least 20 g/l, and up to and including 100 g/l.

Particularly useful pore-widening solutions comprise sodium hydroxide, potassium hydroxide, sulfuric acid, hydrochloric acid, nitric acid, or phosphoric acid.

The pore-widening treatment with the acidic or alkaline solution can be carried out by contacting the electrochemically grained and sulfuric acid anodized support, for example by immersion in the solution, for at least 3 seconds and up to and including 300 seconds, and typically for at least 10 seconds and up to and including 120 seconds to provide columnar pores having an average diameter of at least 15 nm and up to and including 80 nm. The treatment temperature is at least 0° C. and up to and including 110° C. or typically a treatment temperature of at least 20° C. and up to and including 70° C.

Further details of these sulfuric acid anodizing and pore widening processes are provided in copending and commonly assigned U.S. Pat. No. 8,722,308, (filed Aug. 31, 2011 by Hayashi) that is incorporated herein by reference.

Alternative anodic pore treatment is described in U.S. Pat. No. 6,890,700 (Tomita et al.) that is incorporated herein by reference. This publication describes treatment of the anodic oxide layer on the aluminum-containing substrate so that pore opening diameter is different than the pore diameter away from the surface.

An interlayer is formed by treatment of the grained and anodized aluminum-containing support with an aqueous solution of poly(vinyl phosphonic acid) (PVPA) to provide a poly(vinyl phosphonic acid) interlayer. This interlayer formulation can be formed by dissolving poly(vinyl phosphonic acid) in water in an amount of at least 0.05 weight % and up to and including 20 weight %. The formulation can also include optional components such as phosphoric acid, poly (acrylic acid), and copolymers derived in part from vinyl phosphonic acid. The interlayer formulation is applied using any suitable manner and dried to provide a layer having a dry coverage of at least 10 mg/m$^2$ and up to and including 200 mg/m$^2$.

The thickness of the grained and anodized aluminum-containing substrate (with interlayer) can be varied, but should be sufficient to sustain the wear from printing and thin enough to wrap around a printing form. Some embodiments include a grained and anodized aluminum-containing substrate that has a thickness of from at least 100 μm and up to and including 600 μm.

The backside (non-imaging side) of the grained and anodized aluminum-containing substrate can be coated with a non-radiation-sensitive slipping or matte layer to improve handling and "feel" of the lithographic printing plate precursor.

The grained and anodized aluminum-containing substrate can also be in a cylindrical form having the poly(vinyl phosphonic acid) interlayer and imageable layer(s) disposed thereon, and thus be an integral part of the printing press. The use of such imageable cylinders is described for example in U.S. Pat. No. 5,713,287 (Gelbart) that is incorporated herein by reference.

Single Layer Precursors:

Some embodiments of such positive-working lithographic printing plate precursors comprise a single ink receptive layer directly disposed on the interlayer on the grained and anodized aluminum-containing substrate. Other embodiments (described below) comprise a first ink receptive layer disposed directly on the interlayer and a second ink receptive layer disposed on the first ink receptive layer.

The lithographic printing plate precursors comprise one or more of the aromatic acid dyes in the first receptive layer, and optionally one or more infrared radiation absorber within one or more water-insoluble, alkali solution-soluble or -dispersible resins (polymeric binders) that, upon suitable irradiation to infrared radiation, are soluble, dispersible, or removable in processing solutions described below. Thus, the first ink receptive layer, upon infrared radiation irradiation, undergoes a change in solubility properties with respect to the processing solution in its irradiated (exposed) regions.

Compositions of first ink receptive layers in positive-working lithographic printing plate precursors are described for example, in U.S. Pat. No. 6,255,033 (Levanon et al.), U.S. Pat. No. 6,280,899 (Parsons et al.), U.S. Pat. No. 6,391,524 (Yates et al.), U.S. Pat. No. 6,485,890 (Parsons et al.), U.S. Pat. No. 6,558,869 (MNcCullough et al.), U.S. Pat. No. 6,706, 466 (Lott et al.), U.S. Pat. No. 6,541,181 (Levanon et al.), U.S. Pat. No. 7,223,506 (Kitson et al.), U.S. Pat. No. 7,247, 418 (Saraiya et al.), U.S. Pat. No. 7,270,930 (Hauck et al.), U.S. Pat. No. 7,279,263 (Goodin), and U.S. Pat. No. 7,399, 576 (Levanon), and U.S. Published Patent Applications 2006/ 0130689 (Muller et al.), 2005/0214677 (Nagashima), 2004/ 0013965 (Memetea et al.), 2005/0003296 (Memetea et al.), and 2005/0214678 (Nagashima), all incorporated herein by reference.

The first ink receptive layer can contain one or more phenolic polymeric binders that are generally water-insoluble but soluble in alkaline processing solutions (defined below) after infrared radiation imaging. In most embodiments of the lithographic printing plate precursors, these polymeric binders are present in the first ink receptive layer in an amount of at least 10 weight % and typically from at least 20 weight % and up to and including 80 weight % of the total dry first ink receptive layer weight. The term "phenolic" means a hydroxyl-substituted phenyl group.

Useful phenolic polymers include but are not limited to, poly(vinyl phenols) or derivatives thereof. They can also include pendant acidic groups such as carboxylic (carboxy), sulfonic (sulfo), phosphonic (phosphono), or phosphoric acid groups that are incorporated into the polymer molecule or pendant to the polymer backbone. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such resins have a number average molecular weight of at least 3,000 and up to and including 200,000, and typically at least 6,000 and up to and including 100,000, as determined using conventional procedures. Typical novolak resins include, but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or an m,p-cresol mixture with formaldehyde using conventional conditions. For example, some useful novolak resins include, but are not limited to, xylenol-cresol resins, for example, SPN400, SPN420, SPN460, and VPN 1100 (that are available from AZ Electronics) and EP25D40G and EP25D50G (noted below for the Examples) that have higher molecular weights, such as at least 4,000.

Other useful additional resins in the first ink receptive layer include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik); and U.S. Published Patent Applications 2003/0050191 (Bhatt et al.), 2005/ 0051053 (Wisnudel et al.), and 2008/0008956 (Levanon et al.), all of which are incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of at least 1,000 and up to and including 30,000. In addition, they can have a polydispersity of less than 2. The branched poly(hydroxystyrenes) can be homopolymers or copolymers with non-branched hydroxystyrene recurring units.

Another group of useful polymeric binders in the first ink receptive layer are poly(vinyl phenol) and derivatives thereof. Such polymers are obtained generally by polymerization of vinyl phenol monomers, that is, substituted or unsubstituted vinyl phenols. Some vinyl phenol copolymers are described in EP 1,669,803A (Barclay et al.).

The positive-working lithographic printing plate precursor also includes one or more infrared radiation absorbers in one or more ink receptive layers, such as the first ink receptive layer in the single-layer precursors. Such infrared radiation absorbers are sensitive to near-infrared or infrared radiation, for example of at least 700 nm and up to and including 1400 nm and typically at least 750 nm and up to and including 1250 nm.

Some useful infrared radiation absorbers are sensitive to both infrared radiation (typically of at least 700 nm and up to and including 1400 nm) and visible radiation (typically of at least 450 nm and up to and including 700 nm), as described in U.S. Pat. No. 7,429,445 (Munnelly et al.) that is incorporated herein by reference.

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (Furukawa), U.S. Pat. No. 6,787,281 (Tao et al.), U.S. Pat. No. 7,135,271 (Kawauchi et al.), and EP 1,182,033A2 (noted above) all incorporated herein by reference. Infrared radiation absorbing N-alkylsulfate cyanine dyes are described for example in U.S. Pat. No. 7,018,775 (Tao).

In addition to low molecular weight IR-absorbers, dyes having IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (noted above), U.S. Pat. No. 6,153,356 (noted above), and U.S. Pat. No. 5,496,903 (Watanabe et al.) that are incorporated herein by reference. Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Cyanine dyes having an anionic chromophore are also useful. For example, the cyanine dye can have a chromophore having two heterocyclic groups. In another embodiment, the cyanine dye can have from two sulfonic acid groups, such as two sulfonic acid groups and two indolenine groups as described for example in U.S Patent Application Publication No. 2005-0130059 (Tao) that is incorporated herein by reference.

A general description of a useful class of suitable cyanine dyes is shown by the formula in [0026] of WO 2004/101280 (Munnelly et al.).

Useful infrared radiation absorbers can also be pigments including carbon blacks such as carbon blacks that are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

The one or more infrared radiation absorbers can be present in the precursor in an amount generally of at least 0.5 weight % and up to and including 30 weight % and typically at least 3 weight % and up to and including 20 weight %, based on total solids of the ink receptive layer in which the compounds are located. The particular amount needed for this purpose would be readily apparent to one skilled in the art.

In some embodiments, the infrared radiation absorber is present in the single ink receptive layer, identified as the first ink receptive layer. Alternatively or additionally, the infrared radiation absorbers can be located in second ink receptive layer (described below).

The single-layer precursor can be prepared by applying the first ink receptive layer formulation to the interlayer of the grained and anodized aluminum-containing substrate using conventional coating or lamination methods. Thus, the formulation can be applied by dispersing or dissolving the desired ingredients in a suitable coating solvent, and the resulting formulation is applied to the interlayer of the grained and anodized aluminum-containing substrate using suitable equipment and procedures, such as spin coating, knife coating, gravure coating, die coating, slot coating, bar coating, wire rod coating, roller coating, or extrusion hopper coating. The first ink receptive formulation can also be applied by spraying it onto an interlayer.

The dry coating weight for the first ink receptive layer can be at least 0.5 g/m$^2$ to and including 2.5 g/m$^2$ and typically at least 1 g/m$^2$ to and including 2 g/m$^2$.

The selection of solvents used to coat the first ink receptive layer formulation depends upon the nature of the polymeric materials and other components in the formulations, and can be coated out of acetone, methyl ethyl ketone or another ketone, tetrahydrofuran, 1-methoxypropan-2-ol, 1-methoxy-2-propyl acetate, and mixtures thereof using conditions and techniques well known in the art. The coated first ink receptive layer can be dried in a suitable manner.

Multi-Layer Positive-Working Precursors:

Other positive-working lithographic printing plate precursors of this invention are multi-layer precursors that comprise the noted grained and anodized aluminum-containing substrate, the first ink receptive layer (as described above for components, formulation amounts, and dry coverage), and a second ink receptive layer that generally serves as the outermost layer, disposed over the first ink receptive layer. In most embodiments, the second ink receptive layer is disposed directly on the first ink receptive layer.

Before thermal imaging, the second ink receptive layer is generally not soluble or removable by an alkaline processing solution within the usual time allotted for development, but after thermal imaging, the exposed regions of the second ink receptive layer are soluble in the processing solution. In such instances, the first ink receptive layer is also generally removable by the alkaline processing solution.

An infrared radiation absorber (described above) can also be present in such multi-layer precursors. One or more infrared radiation absorbers can be in the first ink receptive layer, the second receptive layer, or both of the first and second ink receptive layers. In still other embodiments, there can be an intermediate layer between the first and second ink receptive layers, and this intermediate layer can also include an infrared radiation absorber layer but can optionally be in a separate layer between the inner and outer layers.

The infrared radiation absorber can be present in the multi-layer precursor in an amount of generally at least 0.5 weight % and up to and including 30 weight % and typically at least 3 weight % and up to and including 25 weight %, based on the total dry weight of the precursor. As noted above, the infrared radiation absorber can be located in one or more layers and the amount of the infrared radiation absorber can be apportioned to the respective layers in a desired manner. The particular amount of a given compound to be used could be readily determined by one skilled in the art.

Materials useful in thermally imageable, multi-layer positive-working lithographic printing plate precursors are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,163,770 (Saraiya et al.), U.S. Pat. No. 7,163,777 (Ray et al.), U.S. Pat. No. 7,186,482 (Kitson et al.), U.S. Pat. No. 7,223,506 (noted above), U.S. Pat. No. 7,229,744 (Patel), U.S. Pat. No. 7,241,556 (Saraiya et al.), U.S. Pat. No. 7,247,418 (noted above), U.S. Pat. No. 7,291,440 (Ray et al.), U.S. Pat. No. 7,300,726 (Patel et al.), and U.S. Pat. No. 7,338,745 (Ray et al.), U.S. Patent Application Publications 2004/0067432 A1 (Kitson et al.) and 2005/0037280 (Loccufier et al.), all incorporated herein by reference.

These multi-layer precursors are formed by suitable application of a first ink receptive layer composition onto the interlayer described above, following by application of a second ink receptive layer formulation.

The second ink receptive layer generally comprises one or more resins or polymeric binders that can be the same or different than the resins (polymeric binders) described above for the first ink receptive layer. The polymeric binders in the second ink receptive layer can be a phenolic polymeric binder as described above for the first ink receptive layer.

The second ink receptive layer can also include one or more colorants as described for example in U.S. Pat. No. 6,294,311 (noted above) that is incorporated herein by reference, including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the imaged and developed precursor. The second ink receptive layer can also optionally include other contrast dyes, printout dyes, coating surfactants, dispersing aids, humectants, biocides, viscosity builders, drying agents, defoamers, preservatives, and antioxidants.

The multi-layer precursors can be prepared by sequentially applying a first ink receptive layer formulation onto the interlayer (described above), and then applying a second ink receptive layer formulation over the first ink receptive layer (usually when dried) using conventional coating or lamination methods. It is important to avoid intermixing of the first and second ink receptive layer formulations.

Thus, the first and second ink receptive layers can be applied by dispersing or dissolving the desired ingredients for each layer in a suitable coating solvent, and the resulting formulations are sequentially or simultaneously applied to the substrate (with the interlayer) using suitable equipment and procedures, such as spin coating, knife coating, gravure coating, die coating, slot coating, bar coating, wire rod coating, roller coating, or extrusion hopper coating. The ink receptive layer formulations can also be applied by spraying onto the substrate (with the interlayer).

The selection of solvents used to coat both the first and second ink receptive layers depends upon the nature of the polymeric binders and other components in the layer formulations. To prevent the first and second ink receptive layer formulations from mixing or the first ink receptive layer from dissolving when the second ink receptive layer formulation is applied, the second ink receptive layer formulation should be coated from a solvent in which the polymeric binder(s) in the first ink receptive layer is(are) insoluble.

Generally, the first ink receptive layer formulation is coated out of a solvent mixture of methyl ethyl ketone (MEK), 1-methoxy-2-propyl acetate (PMA), γ-butyrolactone (BLO), and water; a mixture of MEK, BLO, water, and 1-methoxypropan-2-ol (also known as Dowanol® PM or PGME); a mixture of diethyl ketone (DEK), water, methyl lactate, and BLO; a mixture of DEK, water, and methyl lactate; or a mixture of methyl lactate, methanol, and dioxolane.

The second ink receptive layer formulation can be coated out of solvents or solvent mixtures that do not dissolve the first ink receptive layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof.

After drying the layers, the lithographic printing plate precursors can be further "conditioned" with a heat treatment of at least 40° C. and up to and including 90° C. for at least 4 hours (for example, at least 20 hours) under conditions that inhibit the removal of moisture from the dried layers. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%. In addition, the water-impermeable sheet material can be sealed around the edges of the precursors, with the water-impermeable sheet material being a polymeric film or metal foil that is sealed around the edges of the precursors.

In some embodiments, this heat treatment can be carried out with a stack comprising at least 100 of the same lithographic printing plate precursors, or when the precursor is in the form of a coil or web. When conditioned in a stack, the individual precursors can be separated by suitable interleaving papers. The interleaving papers can be kept between the imageable elements after conditioning during packing, shipping, and use by the customer.

Imaging Conditions

During the method of this invention, the positive-working lithographic printing plate precursor is exposed to a suitable source of exposing infrared radiation depending upon the infrared radiation absorber present in the precursor to provide specific sensitivity that is at a wavelength of at least 700 nm and up to and including 1500 nm, or more likely of at least 750 nm and up to and including 1400 nm. Imagewise exposing provides exposed regions and non-exposed regions in the first ink receptive layer and the second ink receptive layer, if present.

For example, imaging can be carried out using imaging or exposing radiation from an infrared radiation-generating laser (or array of such lasers). Imaging also can be carried out using imaging infrared radiation at multiple infrared wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity, and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of a useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the imageable layer. With these platesetters, any imaging parameters, such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using stepwise imaged lithographic printing plate precursor, a shortened printing run is possible and the obtained prints are also useful for determining such imaging parameters.

Development and Printing

After imaging, the imaged lithographic printing plate precursors can be processed "off-press" using a suitable processing solution described below. When the positive-working lithographic printing plate precursors are imaged and processed, the imaged (exposed) regions in the first ink receptive layer (and second ink receptive layer if present) are removed during processing while the non-exposed regions remain, revealing the grained and anodized aluminum-containing substrate (as well as interlayer).

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable processing solution (described below), and followed by rinsing with water. "Dip" development involves dipping the imaged precursor in a tank or tray containing the appropriate processing solution for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the processing solution in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Thus, the processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kuriu et al.), or by wiping the outermost layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system (spray bar) as described for example in [0124] of EP 1,788,431A2 and U.S. Pat. No. 6,992,688 (Shimazu et al.). As noted above, the imaged precursor can be immersed in the processing solution and rubbed by hand or with an apparatus. To assist in the removal of the back side coating, a brush roller or other mechanical component can be placed in contact with the back side coating during processing.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Such processing can be carried out after imagewise exposing the positive-working lithographic printing plate precursor of this invention that can have a single first ink receptive layer that is disposed over the poly(vinyl phosphonic acid) interlayer, or that can have both first and second ink receptive layers disposed over the noted interlayer, and in which an infrared radiation absorber is present in the first ink receptive layer in an amount of at least 0.5 weight %, based on the first ink receptive layer total dry weight. Such precursors can include the aromatic acid dye in the first ink receptive layer.

Both aqueous alkaline developers and organic solvent-containing developers or processing solutions can be used in the practice of this invention. Some useful processing solutions are described for example, in U.S. Pat. No. 7,507,526 (Miller et al.) and U.S. Pat. No. 7,316,894 (Miller et al.) that are incorporated herein by reference. Useful alkaline aqueous processing solutions (developers) include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These processing compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing processing solutions (developers) are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 weight % and up to 15 weight % based on total processing solution weight. The organic solvent-containing developers can be neutral, alkaline, or slightly acidic in pH, and typically, they are alkaline in pH. Representative organic solvent-containing developers include ND-1 Developer, Developer 980, Developer 1080, 2 in 1 Developer, 955 Developer, D29 Developer (described below), and 956 Developer (all available from Eastman Kodak Company).

Particularly useful processing solutions have a pH of at least 12 and up to and including 14, or more likely at least 12 and up to and including 13.7, or at least 12.5 and up to and including 14, and particularly when such processing solutions are "silicate-free," meaning that they contain less than 1 weight % of silicates and metasilicates, based on total processing solution weight.

Particularly useful silicate-free processing solutions are described in U.S. Patent Application Publication No. 2012/0125216 (Levanon et al.) that is incorporated herein by reference. Such silicate-free processing solutions generally have a pH of at least 12, and typically at least 12 and up to and including 14, or more likely at least 12.5 and up to and including 14. This highly alkaline pH is generally provided using one or more alkali agents other than silicates and metasilicates. Useful alkali agents include alkali metal hydroxides such as sodium hydroxide and potassium hydroxide. Potassium ions can be more prevalent than the sodium ions and the total amount of the alkali metal ions is generally at least 0.3 gram-atom/kg and up to and including 1 gram-atom/kg.

These silicate-free processing solutions can also include one or more metal cations ($M^{2+}$) that are generally selected from the group consisting of barium, calcium, strontium, and zinc cation. Calcium, strontium, and zinc cations are particularly useful. The metal cations $M^{2+}$ are generally present in the processing solutions in an amount of at least 0.001 gram-atom/kg, and typically at least 0.001 gram-atom/kg and up to and including 0.01 gram-atom/kg.

The silicate-free processing solutions can also include one or more chelating agents, each of which has a complex formation constant (log K) for the $M^{2+}$ metal cation of at least 3.5 and less than or equal to 4.5, and a log K for aluminum ion that is 7 or less. Useful chelating agents with these properties include but are not limited to, phosphono-polycarboxylic acids such as phosphonoalkyl polycarboxylic acids, such as 2-phosphonobutane-1,2,4-tricarboxylic acid, which is particularly useful with calcium metal cations. The described chelating agents can be present in an amount of at least 0.01 mol/liter and up to and including 0.1 mol/liter, or typically at least 0.03 mol/liter and up to and including 0.1 mol/liter.

A cationic surfactant or a betaine can also be present in the silicate-free processing solutions in an amount of at least 0.01 weight % and typically at least 0.1 weight % and up to and including 3 weight %. Suitable cationic surfactants for use in the present invention include, but are not limited to, quaternary ammonium halides of fatty acids such as a fatty acid quaternary ammonium chloride. One example of such cationic surfactants is provided in Hydromax 300 (Chemax Performance Products, Greenville, S.C.) that is described for example, in U.S. Patent Application Publication No. 2006/0154187 (Wilson et al.) that is incorporate herein by reference.

The silicate-free processing solutions can also comprise one or more surfactants to achieve the best wetting, stabilizing, solubilizing, protecting, dispersing, and rinsing properties. Such surfactants are generally anionic or nonionic in nature. Useful anionic surfactants are of the alkyaryl sulfonate class, such as an alkylaryl sulfonate, for example, alkyldiphenyloxide disulfonate that is available as Dowfax® 2A1 from Dow Chemical Co. The anionic and nonionic surfactants can be present in an amount of at least 0.1 weight % and up to and including 2 weight %.

Although each processing solution can also be used as its own replenisher, in addition, a specially formulated replenisher can be used. In the replenisher composition, the concentration of alkali agent is generally higher than the concentration of the alkali agent in the working strength processing solution, to compensate for the consumption of the alkali agent during the development process.

Following off-press development, the resulting lithographic printing plate can be postbaked with or without blanket or floodwise exposure to UV or visible radiation. Alternatively, a blanket UV or visible radiation exposure can be carried out, without a postbake operation.

Printing can be carried out by putting the imaged and developed lithographic printing plate on a suitable printing press. The lithographic printing plate is generally secured in the printing press using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the outermost ink receptive layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A positive-working lithographic printing plate precursor that comprises:
   a grained and anodized aluminum-containing substrate,
   a poly(vinyl phosphonic acid) interlayer disposed directly on the grained and anodized aluminum substrate,
   a first ink receptive layer that is disposed directly on the poly(vinyl phosphonic acid) interlayer, the first ink receptive layer comprising at least one water-insoluble, alkali solution-soluble or -dispersible resin, and an aromatic acid dye that comprises at least two aromatic groups and that is present in an amount of at least 0.5 weight %, based on the total dry weight of the first receptive layer,
   the positive-working lithographic printing plate precursor further comprising an infrared radiation absorber in either the first ink receptive layer or in an optional second ink receptive layer that is disposed over the first ink receptive layer, or in both of the first and second ink receptive layers.

2. The precursor of embodiment 1, wherein the aromatic acid dye comprise two or more carboxylate, sulfonate, phenolate, or phosphonate groups.

3. The precursor of embodiment 1 or 2, wherein the aromatic acid dye is selected from the group consisting of bis-azo dyes, tris-azo dyes, triphenyl methane dyes, and anthraquinone dyes.

4. The precursor of any of embodiments 1 to 3, wherein the aromatic acid dye is present in the first ink receptive layer in an amount of at least 0.2 weight % and up to and including 10 weight %, based on the total dry weight of the first ink receptive layer.

5. The precursor of any of embodiments 1 to 4 comprising a grained and a sulfuric acid anodized aluminum substrate.

6. The precursor of any of embodiments 1 to 5 that is a single-layer precursor, wherein the first ink receptive layer is the only imageable layer and which comprises the infrared radiation absorber in an amount of at least 0.5 weight %, based on the first ink receptive layer total dry weight.

7. The precursor of any of embodiments 1 to 5 that is a double-layer precursor comprising the second ink receptive layer disposed over the first ink receptive layer.

8. The precursor of embodiment 7, wherein only the second ink receptive layer comprises the infrared radiation absorber.

9. The precursor of embodiment 7, wherein only the first ink receptive layer comprises the infrared radiation absorber.

10. The precursor of embodiment 7, wherein the same or different infrared radiation absorber is in both of the first ink receptive layer and the second ink receptive layers.

11. The precursor of any of embodiments 1 to 10, wherein the first ink receptive layer is substantially free of basic dyes having an absorption peak of at least 400 nm and up to and including 700 nm.

12. A method for forming a lithographic printing plate, comprising:

imagewise exposing the positive-working lithographic printing plate precursor of any of embodiments 1 to 11 with infrared radiation to form an imaged precursor comprising exposed regions and non-exposed regions in the first ink receptive layer and the second ink receptive layer, if present, and processing the imaged precursor to remove the exposed regions of the first ink receptive layer and of the second ink receptive layer, if present.

13. The method of embodiment 12 comprising processing the imaged precursor using a processing solution having a pH of at least 12 and up to and including 14.

14. The method of embodiment 12 or 13 comprising processing the imaged precursor using a silicate-free processing solution having a pH of at least 12.5 to and including 14.

15. The method of any of embodiments 12 to 14 comprising processing the imaged precursor using a silicate-free developer composition having a pH of at least 12 and comprising at least 0.001 gram-atom/kg of a metal cation $M^{2+}$ selected from the group consisting of barium, calcium, strontium, and zinc cations.

16. The method of embodiment 15 wherein the metal cation $M^{2+}$ is one or more of calcium, strontium, and zinc cations, and is present in the developer composition in an amount of at least 0.001 and up to and including 0.01 gram-atom/kg.

17. The method of any of embodiments 12 to 16 comprising processing the imaged precursor using a silicate-free developer composition further comprising a chelating agent that has a complex formation constant (log K) for the calcium or strontium $M^{2+}$ metal cation of at least 3.5 and less than or equal to 4.5, and a log K for aluminum ion that is 7 or less.

The following Examples are provided to illustrate the practice of this invention and are not meant to be limiting in any manner. In these Examples, the following materials were used (dyes are shown below at the end of the Examples.

---

BLO represents γ-butyrolactone.

Byk ® 307 is a polyethoxylated dimethylpolysiloxane copolymer that is available from Byk Chemie (Wallingford CT).

PM represents Dowanol ® PM.

AC668 was a polymer made using methacrylamide-N-tetrazole, methacrylic acid, N-methoxy methyl methacrylamide, N-phenyl maleimide, and acrylonitrile at an 18.5/4.2/13.9/21.0/42.4 weight % ratio.

AC750 was a polymer made using MAT/MAS/NPMI/Mam/AN/NMMA 15.0/4.2/12.6/23.5/44.7/7.2 weight % ratio with an acid number of 104 methacylamide-N-tetrazole, methacrylic acid, N-methoxy methyl, methacrylamide, N-phenyl maleimide, and acrylonitrile at a 15.0/4.2/12.6/23.5/44.7 weight % ratio.

Substrate A was a 0.3 mm gauge aluminum sheet that had been electrochemically grained and anodized having an $R_a$ of 0.45 and had been subjected to post-treatment with poly(vinyl phosphonic acid).

Substrate B was a 0.3 mm gauge aluminum sheet that had been electrochemically grained and anodized having an $R_a$ surface value of 0.35 and had been subjected to post-treatment with poly(vinyl phosphonic acid).

Solvent Mixture L20 is a solvent mixture of methyl ethyl ketone, PM, BLO, water, and Dioxalane at a 45/20/10/10/15 weight ratio.

Developer 400 xLo is a high pH (over 12) silicate-free processing solution containing potassium hydroxide and sodium citrate as the primary components and small amounts of surfactants.

Electra XD is a high run length thermal positive-working lithographic printing plate precursor that is available from Eastman Kodak Company.

AC739 represents a polyurethane resin made using dimethylolpropionic acid, 1,4-butanediol, 4,4'-diphenylmethanediisocyanate and KF-6001 silicon (carbinol Shinetsu, Japan) at a weight ratio of 24/5.76/10.56/59.69.

Resin B18 is a poly(vinyl acetal) with butyral and salicyldehyde groups.

Resole BPA1100 is a bis-phenol A resole available from Georgia Pacific.

IR Dye A (Trump Dye) is represented by the following formula and can be obtained from Eastman Kodak Company (Rochester, NY).

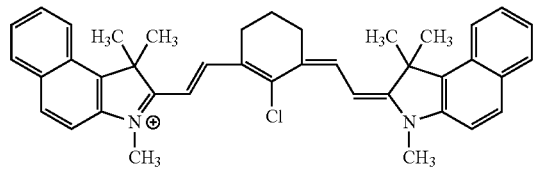 [SMILES: CN1/C(=C/C=C2/CCCC(/C=C/C3=[N+](C)c4ccc5ccccc5c4C3(C)C)=C2Cl)C(C)(C)c2c1ccc1ccccc21]
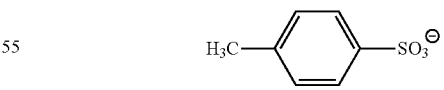

4-DMABA represents dimethyl aminobenzoic acid.

Resole 9900LB is a resole (p-cresol/phenol) resin that is available from Momentive (Germany).

Polyfox ® PF652 is a leveling agent that is available from Omnova (Germany).

Violet 612 is available from Ludewig (Germany).

The following compounds have the noted structures:
CAS 4399-55-7
Direct Blue 71
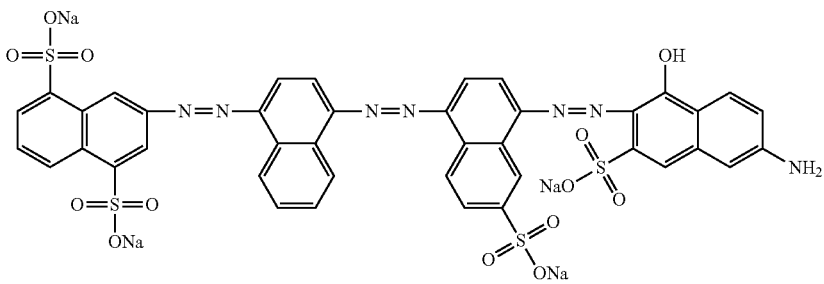
Alizarin Blue
black B
CAS 1324-21-6
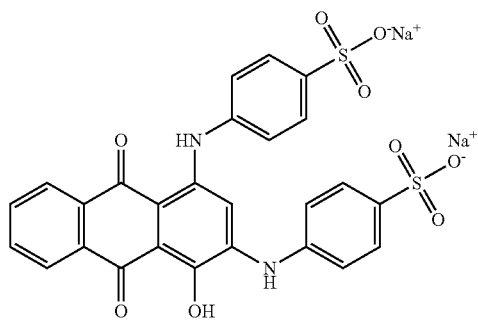
Naphthol blue
black: CAS
Number:
1064-48-8;
anionic Bisaro
dye
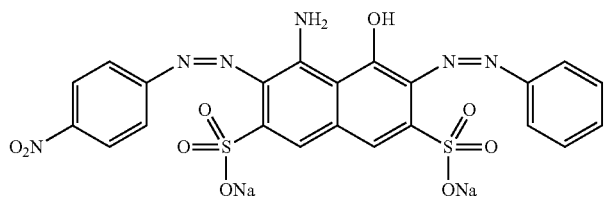
Eosin
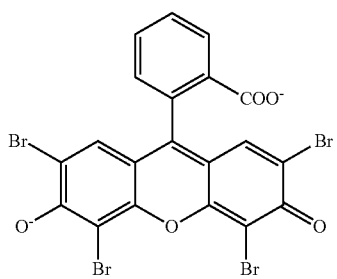
Diamingrün
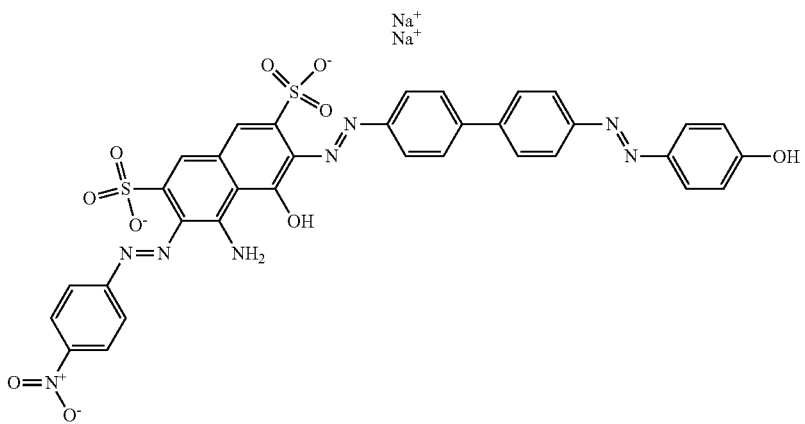 [SMILES: [Na+] ; [Na+] ; Nc1c(/N=N/c2ccc([N+](=O)[O-])cc2)c(S(=O)(=O)[O-])cc2cc(S(=O)(=O)[O-])c(/N=N/c3ccc(-c4ccc(/N=N/c5ccc(O)cc5)cc4)cc3)c(O)c12]

-continued
Trypanblau
CAS 72-57-1
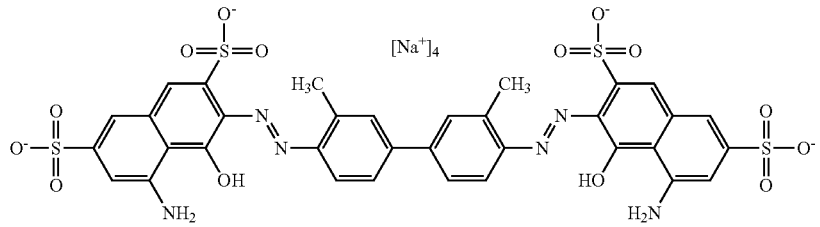
Crystal Violet
CAS 548-62-9
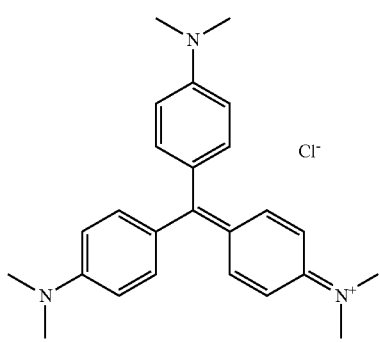
Phloxine
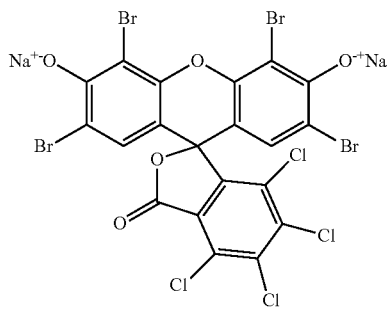
Ethyl Violet
CAS 2390-59-2
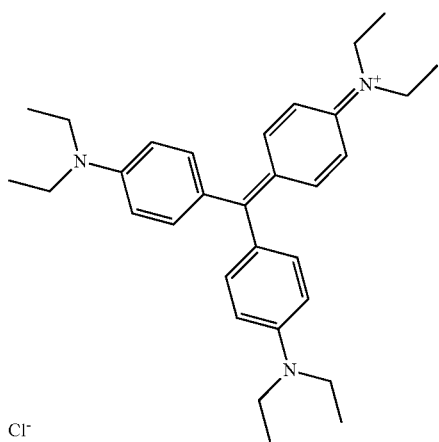 [SMILES: CCN(CC)c1ccc(C(=C2C=CC(=[N+](CC)CC)C=C2)c2ccc(N(CC)CC)cc2)cc1 ; [Cl-]]

| | |
|---|---|
| D11 Dye: Triarylmethane dye (CAS number 433334-19-1) available from PCAS (Longjumeau, France) represented by the structure: | 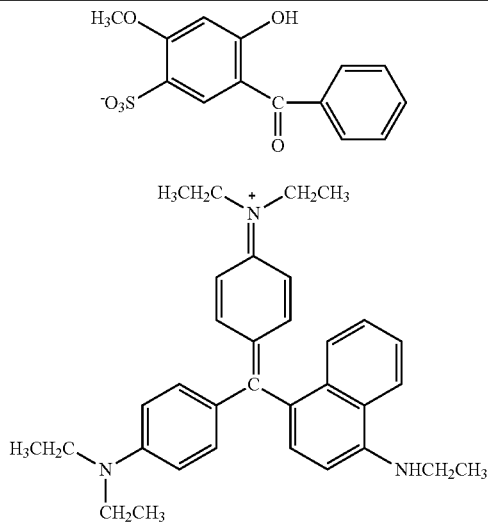 |
| Sudan Black | 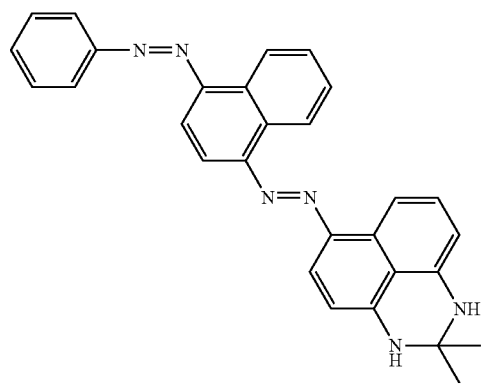 [SMILES: CC1(C)Nc2cccc3c(/N=N/c4ccc(N=Nc5ccccc5)c5ccccc45)ccc(c23)N1] |

Invention Examples 1-3 and Comparative Examples 1-4

Two-layer, positive-working lithographic printing plate precursors were prepared as follows:

First ink receptive Layers A-F were prepared by coating a first ink receptive layer formulation prepared by dissolving the components as shown below in TABLE I in 120 g of Solvent Mixture L20 onto a sample of Substrate A and drying at 80° C. for 2 minutes to provide a dry first ink receptive layer coating weight of 0.8 g/m².

Second ink receptive Layer A was prepared by coating a formulation prepared by dissolving 9.6 g of Resin B18, 6.69 g of Resole 9900LB, 0.42 g of Trump Dye, 0.33 g of Violet 612, 0.33 g Sudan Black, 1.02 g of 4-DMABA, 0.033 g of Byk® 307, and 1.64 AC739 in 380 g of a solvent mixture made up of methyl ethyl ketone and Dowanol® PM (35:65 weight ratio) on a sample of Substrate A and dried to provide a dry second ink receptive layer coating weight of 0.7 g/m².

Second ink receptive Layer B was made by coating a formulation prepared by dissolving 10.46 g of Resin B18, 5.18 g of Resole BPA1100, 0.32 g of Trump Dye, 0.52 g of Violet 612, 0.32 g of 4-DMABA, and 0.03 g of Byk® 307 in 143 g of a solvent mixture made up of methyl ethyl ketone and Dowanol® PM (35:65 weight ratio) on a sample of Substrate A to obtain a dry second ink receptive layer coating weight of 0.7 g/m².

Second ink receptive Layer C was made by coating a formulation prepared by dissolving 1.30 g of Resin B18, 1.25 g of Resole 9900LB, 0.051 g of Trump Dye, 0.041 g of Violet 612, 0.041 g of Sudan Black, 0.04 g of Byk® 307 in 47 g of a solvent mixture made up of methyl ethyl ketone and Dowanol® PM (35:65 weight ratio) on a sample of Substrate A to obtain a dry second ink receptive layer coating weight of 0.7 g/m².

The two-layer lithographic printing plate precursors in Invention Examples 1-3 and Comparative Examples 1-4 were obtained by applying the various second ink receptive layer on the first ink receptive layers as indicated below in TABLE I, and drying using conventional conditions.

TABLE I

| | Invention Example 1 | Invention Example 2 | Invention Example 3 | Comparative Example 1 | Invention Example 4 | Comparative Example 2 | Comparative Example 3 | Comparative Example 4 |
|---|---|---|---|---|---|---|---|---|
| First Ink Receptive Layer | Layer A | Layer A | Layer B | Layer C | Layer A | Layer D | Layer E | Layer F |

TABLE I-continued

|  | Invention Example 1 | Invention Example 2 | Invention Example 3 | Comparative Example 1 | Invention Example 4 | Comparative Example 2 | Comparative Example 3 | Comparative Example 4 |
|---|---|---|---|---|---|---|---|---|
| AC668 | 0 | 0 | 9.78 | 9.78 | 0 | 9.78 | 9.78 | 9.78 |
| AC750 | 9.78 | 9.78 | 0 | 0 | 9.78 | 0 | 0 | 0 |
| Naphthol Blue Black | 0.2 | 0.2 | 0 | 0 | 0.2 | 0 | 0 | 0 |
| Eosin | 0 | 0 | 0.2 | 0 | 0 | 0 | 0 | 0 |
| Dye D11 | 0 | 0 | 0 | 0.2 | 0 | 0 | 0 | 0 |
| Acid Violet | 0 | 0 | 0 | 0 | 0 | 0.2 | 0 | 0 |
| Phloxine | 0 | 0 | 0 | 0 | 0 | 0 | 0.2 | 0 |
| Ethyl violet | 0 | 0 | 0 | 0 | 0 | 0 | 0 | 0.2 |
| Byk ® 307 (10% in PM) | 0.2 | 0.2 | 0.2 | 0.2 | 0.2 | 0.2 | 0.2 | 0.2 |
| N-benzyl-chinolinium bromide | 0 | 0 | 0 | 0.1 | 0 | 0 | 0 | 0 |
| Second Ink Receptive Layer | Layer A | Layer B | Layer A | Layer B | Layer C | Layer A | Layer A | Layer A |

The resulting two-layer positive-working lithographic printing plate precursors were conditioned for 2 days at 60° C. After 1 day at room temperature, an evaluation was carried out processing each precursor using a Mercury Mark 6 processor and Developer 400 xLo at 1500 mm/min processing speed and 23° C.

receptive and thereby transfer lithographic printing ink to the blanket roller on a printing press. As this build-up on the blanket roller becomes stronger, at some point the lithographic printing ink is transferred from the blanket roller to paper copies to cause a dirty background in the non-imaged regions on the printed copies, which is then referred to as "Toning on Paper".

TABLE IA

|  | Invention Example 1 | Invention Example 2 | Invention Example 3 | Comparative Example 1 | Invention Example 4 | Comparative Example 2 | Comparative Example 3 | Comparative Example 4 |
|---|---|---|---|---|---|---|---|---|
| Clear Point (mJ/cm$^2$) | 50 | 50 | 50 | 40 | 80 | 50 | 50 | 40 |
| Linear Point (mJ/cm$^2$) | 100 | 90 | 50 | 66 | 121 | 53 | 50 | 59 |
| ΔE | 0.05 | 0.05 | 0.07 | 0.05 | 0.08 | 0.89 | 0.9 | 1.1 |
| Blanket Toning | None | None | None | Slight | None | High | High | High |
| Toning on Paper | None | None | None | Slight | None | High | High | High |

Performance Evaluation:

Photospeed (Clear Point/Linear Point):

To assess the photospeed, each lithographic printing plate precursor was imaged with test patterns comprising solids and 8×8 checkerboard at 4 W to 16 W in 1 W steps at 360 rpm using a Creo Quantum 800 imagesetter (from 39 mJ/cm$^2$ to 102 mJ/cm$^2$). The imaged precursors were then evaluated for clear point and linear point (50% of 8×8 to give 50% with SpectroPlate from Techkon). "Clear point" is the exposure energy at which no coating residue is visible with the unaided eye. The dot size of the 8×8 pixels is measured with SpectroPlate from Techkon. "Linear point" is the energy setting giving a 50% reading as extrapolated.

Staining (ΔE):

The ΔE was used as a measure for staining. A drop of the Solvent Mixture LM 20 was placed in a spot of a non-image area and ΔE (color difference between within and outside the spot) was measured using an X-Rite densitometer. The results of the performance evaluations are summarized below in TABLE IA. The level of staining was considered negligible when the ΔE was <0.15.

"Blanket Toning" refers to the effect where the non-imaged regions that are supposed to be hydrophilic and lithographic printing ink-repellant, become more lithographic printing ink The results shown in TABLE IA indicate that only Naphthol blue black and Eosin in the first ink receptive layer provided precursors that were free of staining after development. While triphenylmethane dyes such as Ethyl Violet, D11 and Acid violet provided very good contrast, they also caused high staining after development was carried out with the silicate free high pH developer. Eosin, which is similar to the triphenylmethane dyes, provided both good contrast and no staining because it carries acidic groups on each aryl unit.

Invention Examples 4-7 and Comparative Examples 5 and 6

Positive working, single-layer lithographic printing plate precursors for Invention 4-7 and Comparative Example 5 were prepared by coating a first ink receptive layer formulation using the components (in grams) shown below in TABLE II dissolved in a solvent mixture of methyl ethyl ketone and Dowanol® PM (35:65 weight ratio) onto a sample of Substrate A to obtain a dry first ink receptive layer coating weight of 1.3 g/m$^2$. Similarly, in Comparative Example 6, the formulation described in Example 4 of U.S. Pat. No. 6,255,033 (Levanon et al.) was applied to a sample of Substrate A to provide a dry coating weight of 1.3 g/m$^2$.

TABLE II

| Dye | Invention Example 4 Diamingrün | Invention Example 5 Direct Blue 71 | Invention Example 6 Trypanblau | Invention Example 7 Alizarin Blue black B | Comparative Example 5 Crystal Violet |
|---|---|---|---|---|---|
| Resin B18 | 2.61 | 2.61 | 2.61 | 2.61 | 2.61 |
| Resole BPA 1100 | 1.30 | 1.30 | 1.30 | 1.30 | 1.30 |
| Trump Dye | 0.08 | 0.08 | 0.08 | 0.08 | 0.08 |
| 4-DMABA | 0.08 | 0.08 | 0.08 | 0.08 | 0.08 |
| Polyfox® PF 652 | 0.02 | 0.02 | 0.02 | 0.02 | 0.02 |
| Contrast Dye | 0.13 | 0.13 | 0.13 | 0.13 | 0.13 |
| Solvent Mixture | 35.78 | 35.78 | 35.78 | 35.78 | 35.78 |

The single-layer positive-working lithographic printing plate precursor was then conditioned for 2 days at 60° C.

Performance Evaluation:

To assess the photospeed, each precursor was imaged with test patterns comprising solids and 8×8 checker board using a Creo Quantum 800 imagesetter at energies between 50 mJ/cm² to 120 mJ/cm². The imaged precursors were then developed using a Mercury Mk6 processor and Developer 400 xLo at 2000 mm/minute processing speed and 21° C.

Each lithographic printing plate was evaluated for clear point and linear point (both defined above).

Staining (ΔE):

The level of staining of the non image area in each lithographic printing plate was measured using ΔE. This was done by placing a drop of the solvent mixture Dowanol® PM/MEK (1:1 weight ratio) in a spot of a non-image area at the exposure energy at linear point, and ΔE (the color difference between within and outside the spot) was measured using an X-Rite densitometer. The level of staining was considered negligible when the ΔE was <0.15.

The results of the performance evaluation are summarized below in below TABLE IIA.

TABLE IIA

| | Invention Example 4 | Invention Example 5 | Invention Example 6 | Invention Example 7 | Comparative Example 5 | Comparative Example 6 |
|---|---|---|---|---|---|---|
| Clear point (mJ/cm²) | 70 | 70 | 70 | 70 | 70 | 70 |
| Linear Point (mJ/cm²) | 138 | 127 | 125 | 132 | 123 | 123 |
| ΔE | 0.09 | 0.09 | 0.11 | 0.1 | >1 | >1 |
| Blanket Toning | None | None | None | None | High | High |
| Toning on Paper | None | None | None | None | High | High |

The results shown in TABLE IIA indicate that only the aromatic acid dyes used in Invention Examples 4-7 provided no staining. The toning evaluation was made by printing up to 10,000 copies. As noted in TABLES IA and IIA, all lithographic printing plates that exhibited a ΔE of >0.15 showed either blanket toning, toning on paper, or both.

Press Test:

The contrast dyes used according to the present invention (for example, Naphthol blue black) provided strong contrast as desired without causing undesirable staining from imaged positive-working lithographic printing plate precursors that comprised a substrate that had been post-treated with poly (vinyl phosphonic acid) and were developed with a high pH, silicate-free processing solution (for example, Developer 400 xLo). Without being limited to a particular mechanism, it is believed that this unexpected property is provided by the high concentration of solubilizing groups in the contrast dyes, which solubilizing groups improve their solubility in the processing solution but which have a lower tendency to adhere to the poly(vinyl phosphonic acid) interlayer on the substrate.

It was found that this unexpected result was achieved with both single-layer and double-layer positive-working lithographic printing plate precursors.

The invention has been described in detail with particular reference to certain preferred embodiments thereof, but it will be understood that variations and modifications can be effected within the spirit and scope of the invention.

The invention claimed is:

1. A method for forming a lithographic printing plate, comprising:

imagewise exposing a positive-working lithographic printing plate precursor with infrared radiation to form an imaged precursor comprising exposed regions and non-exposed regions in a first ink receptive layer and a second ink receptive layer, if present, and processing the imaged precursor to remove the exposed regions of the first ink receptive layer and of the second ink receptive layer, if present, using a silicate-free processing solution having a pH of at least 12 and up to and including 14 and comprising at least 0.001 gram-atom/kg of a metal cation $M^{2+}$ selected from the group consisting of barium, calcium, strontium, and zinc cations;

the positive-working lithographic printing plate precursor comprising a grained and anodized aluminum-containing substrate, a poly(vinyl phosphonic acid) interlayer disposed directly on the grained and anodized aluminum-containing substrate, a first ink receptive layer that is disposed directly on the poly(vinyl phosphonic acid) interlayer, the first ink receptive layer comprising at least one water-insoluble, alkali solution-soluble or -dispersible resin, and an aromatic acid dye that is Naphthol blue black, Trypanblau, Direct Blue 71, or Diamingrün having the structures shown below, the aromatic acid dye being present in an amount of at least 0.5 weight %, based on the total dry weight of the first ink receptive layer, the positive-working lithographic printing plate precursor being infrared radiation-sensitive and further comprising an infrared radiation absorber in either the first ink receptive layer or in an optional second ink receptive layer that is disposed over the first ink receptive layer, or in both of the first and the second ink receptive layers, Direct Blue 71

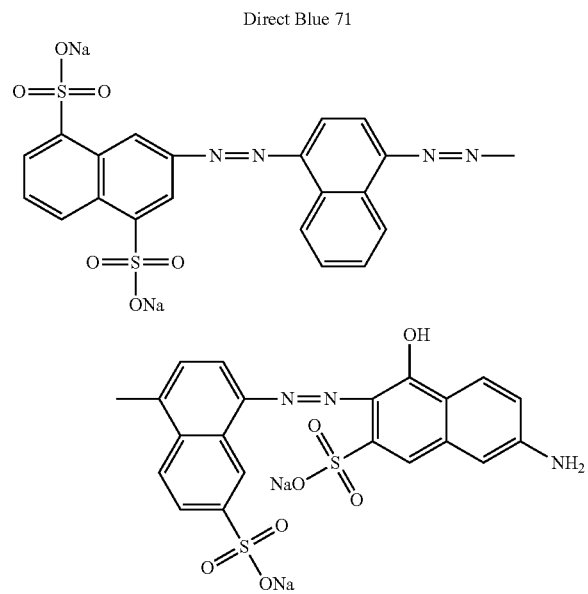

Naphthol blue black

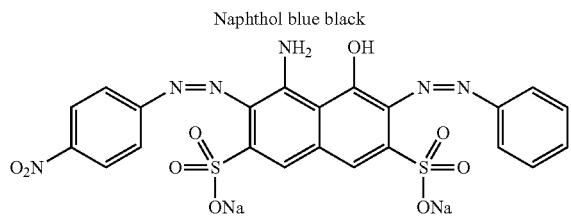

Diamingrün

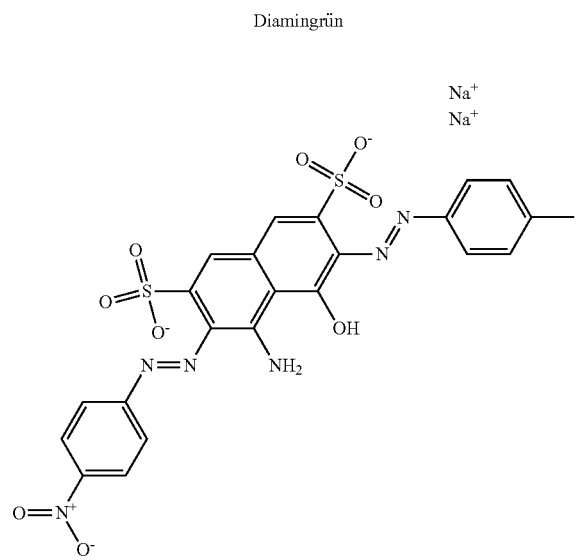

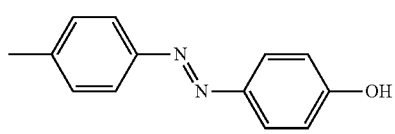

Trypanblau

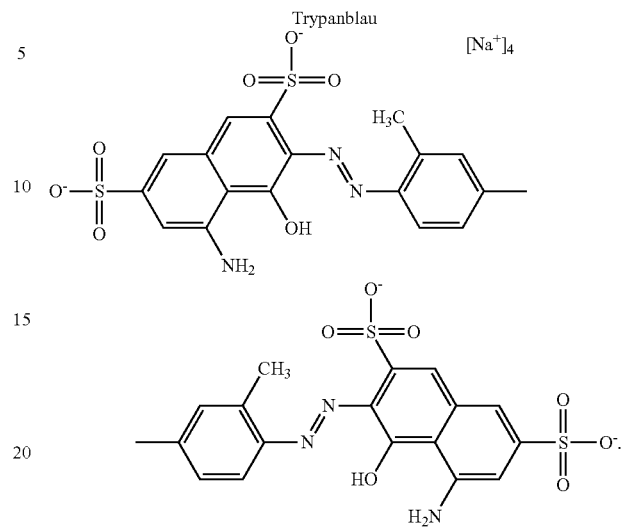

2. The method of claim 1 comprising imagewise exposing the positive-working lithographic printing plate precursor comprising the first ink receptive layer and no second ink receptive layer.

3. The method of claim 1, comprising imagewise exposing the positive-working lithographic printing plate precursor comprising a second ink receptive layer over the first ink receptive layer.

4. The method of claim 1 wherein the metal cation $M^{2+}$ is one or more of calcium, strontium, and zinc cations, and is present in the silicate-free processing solution in an amount of at least 0.001 and up to and including 0.01 gram-atom/kg.

5. The method of claim 1, wherein the silicate-free processing solution further comprises a chelating agent that has a complex formation constant (log K) for calcium or strontium $M^{2+}$ metal cation of at least 3.5 and less than or equal to 4.5, and a log K for aluminum ion that is 7 or less.

6. The method of claim 1, wherein the grained and anodized aluminum-containing substrate is a grained and a sulfuric acid anodized aluminum-containing substrate.

7. The method of claim 2, wherein the first ink receptive layer in the positive-working lithographic printing plate precursor comprises the infrared radiation absorber in an amount of at least 0.5 weight %, based on the first ink receptive layer total dry weight.

8. The method of claim 3, wherein only the second ink receptive layer in the positive-working lithographic printing plate precursor comprises the infrared radiation absorber.

9. The method of claim 3, wherein only the first ink receptive layer in the positive-working lithographic printing plate precursor comprises the infrared radiation absorber.

10. The method of claim 3, wherein the same or different infrared radiation absorber is in both of the first ink receptive layer and the second ink receptive layers of the positive-working lithographic printing plate precursor.

11. The method of claim 1, wherein the first ink receptive layer of the positive-working lithographic printing plate precursor comprises less than 0.1 weight %, based on the total dry weight of the first ink receptive layer, of basic dyes having an absorption peak of at least 400 nm and up to and including 700 nm.

12. A method for forming a lithographic printing plate, comprising:

imagewise exposing a positive-working lithographic printing plate precursor with infrared radiation to form an imaged precursor comprising exposed regions and non-exposed regions in a first ink receptive layer and a second ink receptive layer, if present, and processing the imaged precursor to remove the exposed regions of the first ink receptive layer and of the second ink receptive layer, if present, using a silicate-free processing solution having a pH of at least 12 and up to and including 14 and comprising at least 0.001 gram-atom/kg of a metal cation $M^{2+}$ selected from the group consisting of barium, calcium, strontium, and zinc cations;

the positive-working lithographic printing plate precursor comprising a grained and anodized aluminum-containing substrate, a poly(vinyl phosphonic acid) interlayer disposed directly on the grained and anodized aluminum-containing substrate, a first ink receptive layer that is disposed directly on the poly(vinyl phosphonic acid) interlayer, the first ink receptive layer comprising at least one water-insoluble, alkali solution-soluble or -dispersible resin, and an aromatic acid dye that is Naphthol blue black that is present in an amount of at least 0.5 weight %, based on the total dry weight of the first ink receptive layer, the positive-working lithographic printing plate precursor being infrared radiation-sensitive and further comprising an infrared radiation absorber in either the first ink receptive layer or in an optional second ink receptive layer that is disposed over the first ink receptive layer, or in both of the first and the second ink receptive layers.

* * * * *